(12) United States Patent
Dimitrov et al.

(10) Patent No.: US 8,390,963 B2
(45) Date of Patent: Mar. 5, 2013

(54) TRILAYER READER WITH CURRENT CONSTRAINT AT THE ABS

(75) Inventors: Dimitar V. Dimitrov, Edina, MN (US); Dian Song, Eden Prairie, MN (US); Thu Van Nguyen, Shakopee, MN (US); Carolyn Pitcher Van Dorn, Crystal, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/093,365

(22) Filed: Apr. 25, 2011

(65) Prior Publication Data

US 2012/0268847 A1  Oct. 25, 2012

(51) Int. Cl.
*G11B 5/39* (2006.01)
*G11B 5/127* (2006.01)

(52) U.S. Cl. ................................ 360/319; 360/324
(58) Field of Classification Search .......... 360/324.11, 360/324.12, 327.1, 327.2, 327.35, 327.31, 360/319, 324
See application file for complete search history.

(56) References Cited

U.S. PATENT DOCUMENTS

| | | | | |
|---|---|---|---|---|
| 5,576,914 A * | 11/1996 | Rottmayer et al. | ............ | 360/324 |
| 5,739,987 A * | 4/1998 | Yuan et al. | ................. | 360/327.32 |
| 5,835,314 A * | 11/1998 | Moodera et al. | ........... | 360/324.2 |
| 5,838,521 A | 11/1998 | Ravipati | | |
| 6,282,068 B1 * | 8/2001 | Pinarbasi | .................. | 360/324.11 |
| 6,353,316 B1 * | 3/2002 | Amano | .......................... | 324/252 |
| 6,556,388 B1 * | 4/2003 | Everitt et al. | .................. | 360/314 |
| 6,667,862 B2 | 12/2003 | Zhu | | |
| 6,724,583 B2 * | 4/2004 | Seigler et al. | ............ | 360/324.12 |
| 6,735,062 B1 * | 5/2004 | Pokhil et al. | ................ | 360/324.12 |
| 6,775,111 B2 * | 8/2004 | Lin et al. | .................. | 360/324.11 |
| 6,914,759 B2 | 7/2005 | Chen et al. | | |
| 6,930,865 B2 * | 8/2005 | Ghaly et al. | ............. | 360/324.12 |
| 7,035,062 B1 * | 4/2006 | Mao et al. | .................... | 360/324.2 |
| 7,093,347 B2 | 8/2006 | Nowak et al. | | |
| 7,177,122 B2 * | 2/2007 | Hou et al. | ................. | 360/324.12 |
| 7,333,304 B2 | 2/2008 | Gill et al. | | |
| 7,333,306 B2 * | 2/2008 | Zhao et al. | ............... | 360/324.12 |
| 7,369,374 B2 * | 5/2008 | Gill et al. | ............... | 360/324.12 |
| 7,436,637 B2 * | 10/2008 | Pinarbasi | ................. | 360/324.11 |
| 7,446,982 B2 * | 11/2008 | Gill | ......................... | 360/324.11 |
| 7,551,394 B2 | 6/2009 | Sasaki et al. | | |
| 7,573,684 B2 * | 8/2009 | Seigler et al. | ................. | 360/322 |
| 7,602,591 B2 * | 10/2009 | Sbiaa et al. | ............. | 360/324.12 |
| 7,615,996 B1 * | 11/2009 | Machita et al. | ............... | 324/252 |
| 7,791,844 B2 * | 9/2010 | Carey et al. | ............. | 360/324.12 |
| 7,851,840 B2 | 12/2010 | Diao et al. | | |
| 7,876,534 B2 * | 1/2011 | Chou et al. | ..................... | 360/319 |
| 7,894,166 B2 * | 2/2011 | Yamazaki et al. | ........ | 360/324.11 |
| 8,063,633 B2 * | 11/2011 | Raberg et al. | ................. | 324/252 |
| 2002/0114111 A1 * | 8/2002 | Zhu | .............................. | 360/324.1 |
| 2002/0126428 A1 * | 9/2002 | Gill | ......................... | 360/324.12 |
| 2002/0191348 A1 * | 12/2002 | Hasegawa et al. | ............ | 360/314 |
| 2003/0179515 A1 * | 9/2003 | Pinarbasi | ................. | 360/324.11 |
| 2003/0214764 A1 * | 11/2003 | Sapozhnikov et al. | .. | 360/324.12 |
| 2004/0161636 A1 | 8/2004 | Hujanen et al. | | |
| 2005/0063100 A1 | 3/2005 | Kautzky et al. | | |

(Continued)

*Primary Examiner* — Brian Miller
(74) *Attorney, Agent, or Firm* — Hall Estill Attorneys at Law (57) ABSTRACT

A magnetoresistive read sensor is described. The sensor is a magnetically responsive stack positioned between top and bottom electrodes on an air bearing surface. Current in the sensor is confined to regions close to the air bearing surface by a first multilayer insulator structure between the stack and at least one electrode to enhance reader sensitivity.

17 Claims, 8 Drawing Sheets

U.S. PATENT DOCUMENTS

| | | | |
|---|---|---|---|
| 2005/0088789 A1* | 4/2005 | Hou et al. | 360/324.12 |
| 2006/0245117 A1 | 11/2006 | Nowak et al. | |
| 2006/0256485 A1* | 11/2006 | Seigler et al. | 360/324.12 |
| 2007/0247752 A1* | 10/2007 | Otagiri et al. | 360/126 |
| 2008/0094761 A1* | 4/2008 | Freitag et al. | 360/324.12 |
| 2008/0198507 A1* | 8/2008 | Maruyama et al. | 360/123.01 |
| 2009/0034132 A1* | 2/2009 | Miyauchi et al. | 360/324 |
| 2011/0026169 A1* | 2/2011 | Gill et al. | 360/324.12 |
| 2011/0228428 A1* | 9/2011 | Dimitrov et al. | 360/320 |

* cited by examiner

TRILAYER READER WITH CURRENT CONSTRAINT AT THE ABS

RELATED APPLICATION

Reference is made to U.S. application Ser. No. 12/727,698 filed Mar. 19, 2010 titled TRILAYER READER WITH CURRENT CONSTRAINT AT THE ABS, which is incorporated by reference.

SUMMARY

A magnetoresistive sensor includes a magnetically responsive stack positioned between top and bottom electrodes on an air bearing surface. A multilayer insulator structure between the stack and at least one electrode such that a current passing through the stack is confined to the vicinity of the air bearing surface to increase sensitivity.

BRIEF DESCRIPTION OF THE DRAWINGS

According to an embodiment.

According to an embodiment.

According to an embodiment.

According to an embodiment.

According to an embodiment.

According to an embodiment.

According to an embodiment.

According to an embodiment.

According to an embodiment.

According to an embodiment.

DETAILED DESCRIPTION

Reduced shield-to-shield spacing can be achieved through the use of trilayer readers with dual free-layers. In a trilayer structure, two free-layers with magnetization in a scissor orientation are used to detect media magnetic flux. Synthetic antiferromagnetic (SAF) and antiferromagnetic (AFM) layers are not needed and free layer biasing comes from the combination of backend permanent magnet and demagnetization fields when both free layers have ends at the air bearing surface. Since the PM is recessed from the ABS surface, it does not interfere with the ability to achieve smaller shield-to-shield spacing without a sacrifice of PM material properties and bias field. Trilayer readers with a short stripe height and backend magnetic biasing have high readback signal but can be magnetically unstable and are very sensitive to process variations.

Figure 1:
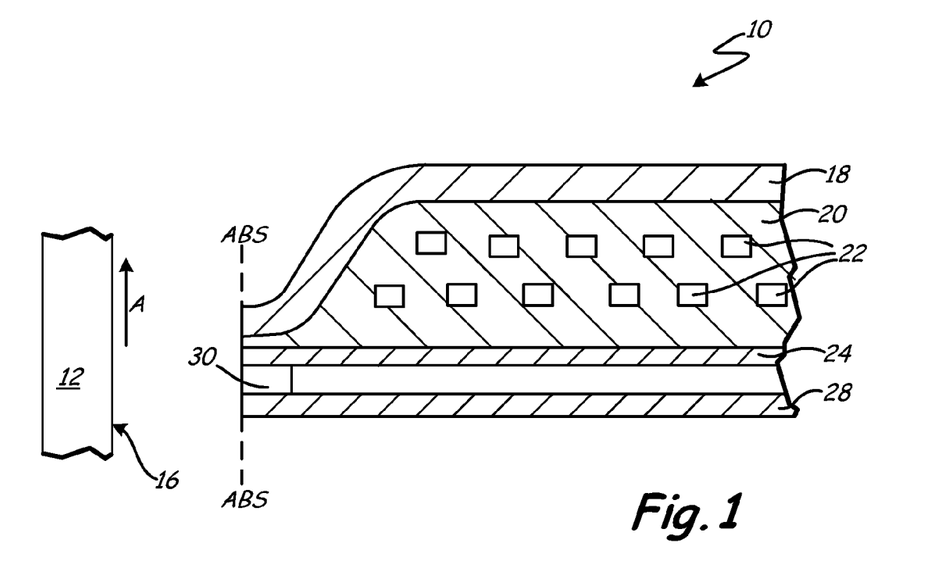
FIG. 1 is a schematic cross-sectional view of a magnetic read/write head and magnetic disc taken along a plane normal to an air bearing surface (ABS) of the read/write head.

FIG. 1 is a schematic cross-sectional view of an example embodiment of a magnetic read/write head 10 and magnetic disc 12 taken along a plane normal to air bearing surface ABS of read/write head 10. Air bearing surface ABS of magnetic read/write head 10 faces disc surface 16 of magnetic disc 12. Magnetic disc 12 travels or rotates in a direction relative to magnetic read/write head 10 as indicated by arrow A. Spacing between air bearing surface ABS and disc surface 16 is preferably minimized while avoiding contact between magnetic read/write head 10 and magnetic disc 12.

A writer portion of magnetic read/write head 10 includes top pole 18, insulator 20, conductive coils 22, and bottom pole/top shield 24. Conductive coils 22 are held in place between top pole 18 and top shield 24 by use of insulator 20. Conductive coils 22 are shown in FIG. 1 as two layers of coils but may also be formed of any number of layers of coils as is well known in the field of magnetic read/write head design.

A reader portion of magnetic read/write head 10 includes bottom pole/top shield 24, bottom shield 28, and magnetoresistive (MR) stack 30. MR stack 30 is positioned between terminating ends of bottom pole 24 and bottom shield 28. Bottom pole/top shield 24 functions both as a shield and as a shared pole for use in conjunction with top pole 18.

Figure 2:
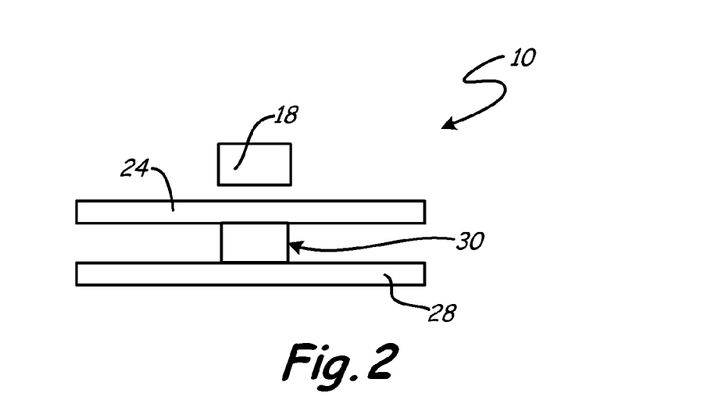
FIG. 2 is a schematic ABS view of the magnetic read/write head of FIG. 1.

FIG. 2 is a schematic view of air bearing surface ABS of the example magnetic read/write head 10 of FIG. 1. FIG. 2 illustrates the location of magnetically significant elements in magnetic read/write head 10 as they appear along air bearing surface ABS of magnetic read/write head 10 of FIG. 1. In FIG. 2 all spacing and insulating layers of magnetic read/write head 10 are omitted for clarity. Bottom shield 28 and bottom pole/top shield 24 are spaced to provide for a location of MR stack 30. A sense current is caused to flow through MR stack 30 via bottom pole/top shield 24 and bottom shield 28. While the sense current is injected through the bottom pole/top shield 24 and bottom shield 28 in FIGS. 1 and 2, other configurations have MR stack electrically isolated from bottom pole/top shield 24 and bottom shield 28 with additional leads providing the sense current to MR stack 30. As the sense current is passed through MR stack 30, the read sensor exhibits a resistive response, which results in a varied output voltage. Because the sense current flows perpendicular to the plane of MR stack 30, a reader portion of magnetic read/write head 10 is a current perpendicular to plane (CPP) type device. Magnetic read/write head 10 is merely illustrative and other CPP configurations may be used in accordance with various embodiments of the present invention.

Figure 3:
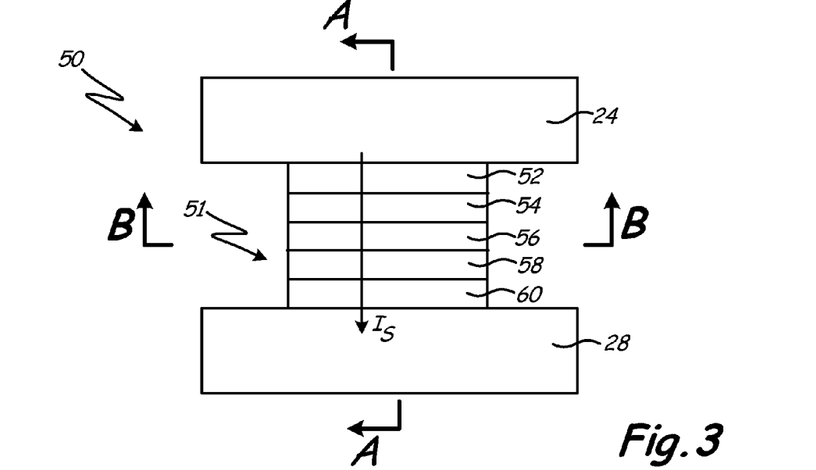
FIG. 3 shows a schematic ABS view of a typical trilayer current perpendicular to the plane (CPP) sensor stack.

FIG. 3 shows an ABS view of an embodiment of a trilayer CPP MR sensor 50 comprising trilayer MR stack 51. MR stack 51 includes metal cap layer 52, first freelayer 54, nonmagnetic layer 56, second freelayer 58, and metal seedlayer 60. Trilayer MR stack 51 is positioned between bottom pole/top shield 24 and bottom shield 28.

In operation, sense current $I_s$ flows perpendicularly to the plane of layers 52-60 of trilayer MR stack 51 and experiences a resistance which is proportional to the cosine of an angle formed between the magnetization directions of first freelayer 54 and second free layer 58. The voltage across trilayer MR stack 51 is then measured to determine the change in resistance and the resulting signal is used to recover encoded information from the magnetic medium. It should be noted that trilayer MR stack 51 configuration is merely illustrative and other layer configurations for trilayer MR stack 51 may be used in accordance with various embodiments of the present invention.

Figure 4:
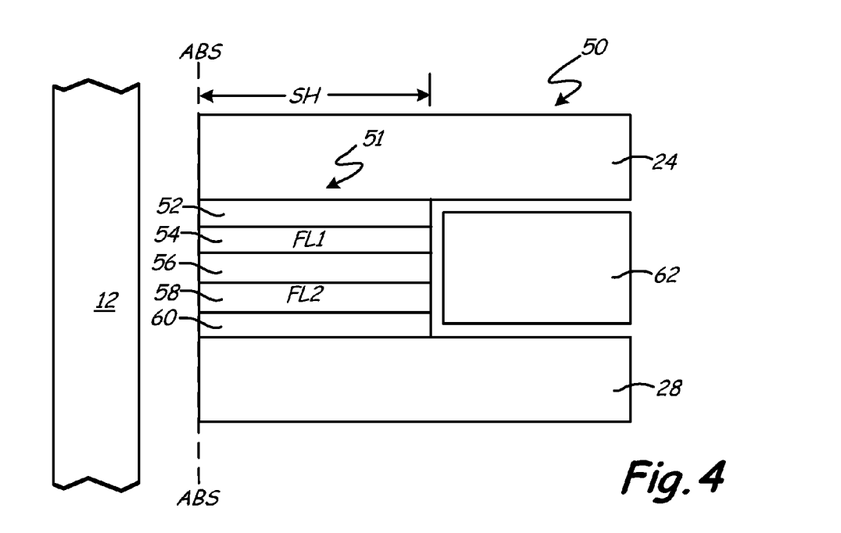
FIG. 4 is a schematic cross-sectional view of the sensor stack shown in FIG. 3 taken along section A-A.

The magnetization orientations of first freelayer 54 and second freelayer 58 in trilayer MR stack 51 are antiparallel and initially set parallel to the ABS in the absence of other magnetic fields or forces. The alignment of the freelayers in this antiparallel direction is attributed to magnetostatic interactions between the two freelayers and occurs when the reader width (RW) is larger than the stripe height (SH). To increase the sensitivity of the reader, the alignment of the two freelayers is preferably an orthogonal alignment relative to each other and about 45 degrees to the ABS, respectively. This is accomplished by a back bias magnet, (not shown in FIG. 3) behind trilayer MR stack 51 biasing each freelayer. FIG. 4, which is a schematic cross-section of the example CPP MR sensor 50 taken along section A-A in FIG. 3, shows back bias magnet 62 behind MR stack 51 recessed from the ABS and positioned between bottom pole/top shield 24 and bottom shield 28. The length of trilayer sensor stack 51 behind the ABS is the stripe height SH and, as will be shown, is an important variable in embodiments to be discussed.

Figures 5, 5A:
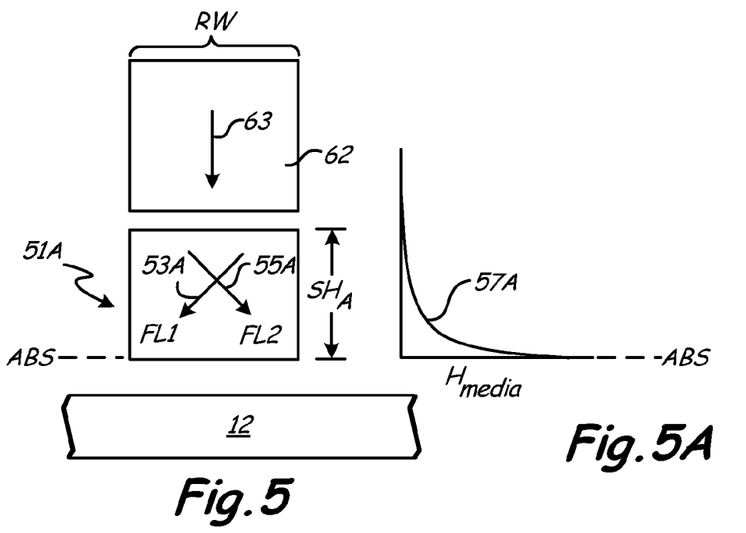
FIG. 5 is a schematic cross-sectional view of a trilayer sensor with a short stripe height taken along section B-B in FIG. 3.
FIG. 5A is a graph of magnetic field strength in the trilayer sensor of FIG. 5.

A schematic cross-section perpendicular to the ABS of trilayer CPP MR sensor 50 along section B-B in FIG. 3 is shown in FIG. 5. Trilayer MR stack 51A with air bearing surface ABS is shown positioned above recording medium 12. Back bias magnet 62 is shown positioned above trilayer MR stack 51A recessed from air bearing surface ABS.

Trilayer MR stack 51A has a layer structure identical to trilayer MR stack 51. Magnetization of back bias magnet 62 is shown by arrow 63 as pointing in a vertical downward direction towards air bearing surface ABS. Magnetizations of first freelayer FL1 and second freelayer FL2 of trilayer MR stack 51 are shown schematically by arrows 53A and 55A respectively. As noted earlier, in the absence of back bias magnet 62, magnetizations 53A and 55A would be parallel to the ABS and antiparallel to each other. The presence of back bias magnet 62 forces magnetizations 53A and 55A into a scissor relationship as shown.

Curve 57A in the graph of FIG. 5A depicts the magnetic field strength $H_{media}$ from recording medium 12 in trilayer MR stack 51A. As shown in FIG. 5A, the magnetic field strength in the sensor decays exponentially as a function of distance from the ABS. In the sensor geometry shown in FIG. 5, the reader width RW is larger than the stripe height $SH_A$ of trilayer stack 51A. The scissors relation of magnetizations 53A and 55A of freelayers FL1 and FL2 result in increased sensitivity because both magnetizations freely respond to $H_{media}$, the media flux. However, minor changes caused by process variability during fabrication can cause unacceptably large variability in sensor output or even magnetically unstable parts that will decrease product yield to unacceptable levels.

Figure 6:
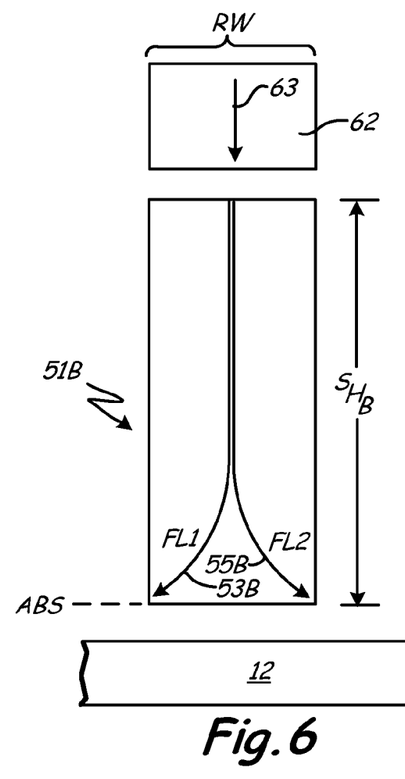
FIG. 6 is a schematic cross-sectional view of a trilayer sensor with a long stripe height taken along section B-B in FIG. 3.
Figure 6A:
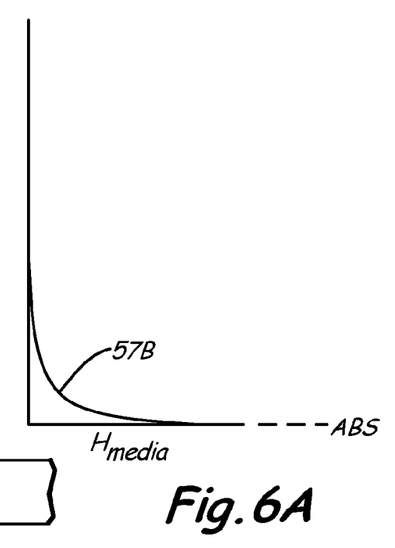
FIG. 6A is a graph of magnetic field strength in the trilayer sensor of FIG. 6.

A variation of the sensor geometry shown in FIG. 5 is shown in FIG. 6. Back bias magnet 62 is shown positioned above trilayer MR stack 51B distal from air bearing surface ABS. Trilayer MR stack 51B has a layer structure identical to trilayer MR stack 51. Trilayer MR stack 51B differs from trilayer MR stack 51A in that the stripe height $SH_B$ of trilayer MR stack 51B is longer than the reader width RW of trilayer MR stack 51B by at least a factor of two. Both sensor stacks 51A and 51B have the same reader width RW. Magnetization of back bias magnet 62 is shown by arrow 63 as pointing in a vertical downward direction toward air bearing surface ABS. Magnetizations of first freelayer FL1 and second freelayer FL2 are shown schematically by arrows 53B and 55B respectively.

In contrast to the magnetization orientations of trilayer MR stack 51A, the magnetizations of each freelayer at the back-end of trilayer MR stack 51B are stable and parallel to the magnetization of back bias magnet 62 as indicated by arrow 63. Due to the long stripe height of trilayer MR stack 51B, the magnetization of free layers FL1 and FL2 naturally, relax into the divergent orientations proximate the ABS as shown by arrows 53B and 55B due to the magnetostatic interaction between FL1 and FL2. The stability and robustness of trilayer sensor stack 51B significantly exceeds that of trilayer MR stack 51A. The increased stability, however, comes with a cost. As a result of the increased stripe height, a majority of the length of trilayer MR stack 51B does not contribute to the magnetoresistive sensing signal. Rather, the back end of the sensor stack functions as an electrical shunt, thereby decreasing the sensor output.

Solutions to the problem that provide trilayer reader sensors with robust stability as well as increased sensitivity are shown in FIGS. 7-10.

Figure 7:
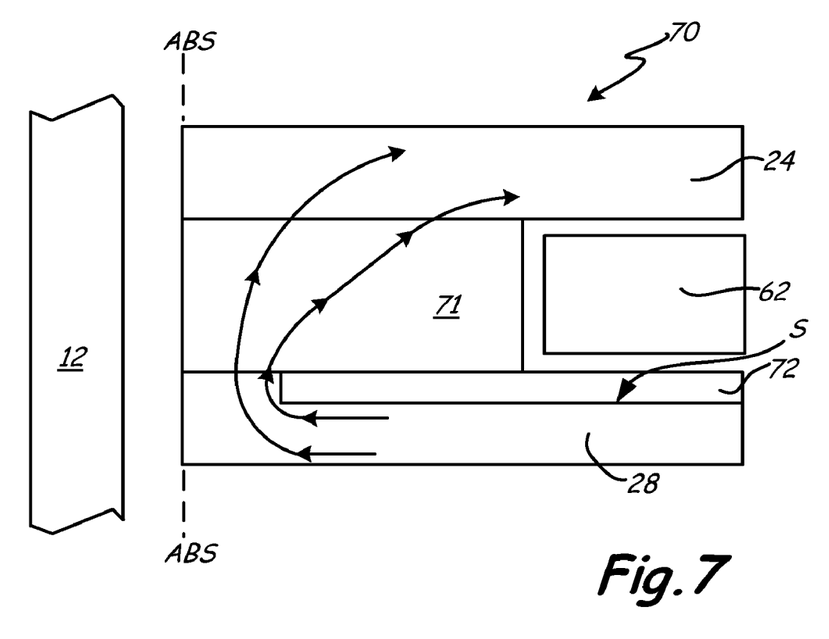
FIGS. 7-10 are schematic cross-sectional views of four different embodiments of a trilayer sensor.

One embodiment is shown by CPP MR sensor 70 in FIG. 7. In CPP MR sensor 70, trilayer MR stack 71 has a stripe height of at least twice reader width RW as shown in FIG. 6, CPP MR sensor 70 is comprised of trilayer MR stack 71 positioned between bottom pole/top shield 24 and bottom shield 28 with back gap magnet 62 behind the trilayer MR stack 51 as in CPP MR sensor 50 shown in FIG. 4. The difference is that insulator layer 72 in CPP MR sensor 70 is positioned between trilayer MR stack 71 and bottom shield 28. Insulator layer 72 extends from the back end of bottom shield 28 to a distance close to the ABS, thereby providing a constriction in the current flow from bottom shield 28 through trilayer MR stack 57 to bottom pole/top shield 24. By constricting the current flow to the vicinity of the ABS, as shown by the arrows, electrical shunting at the back end of trilayer MR stack 71 is blocked resulting in increased sensor output.

Figure 8:
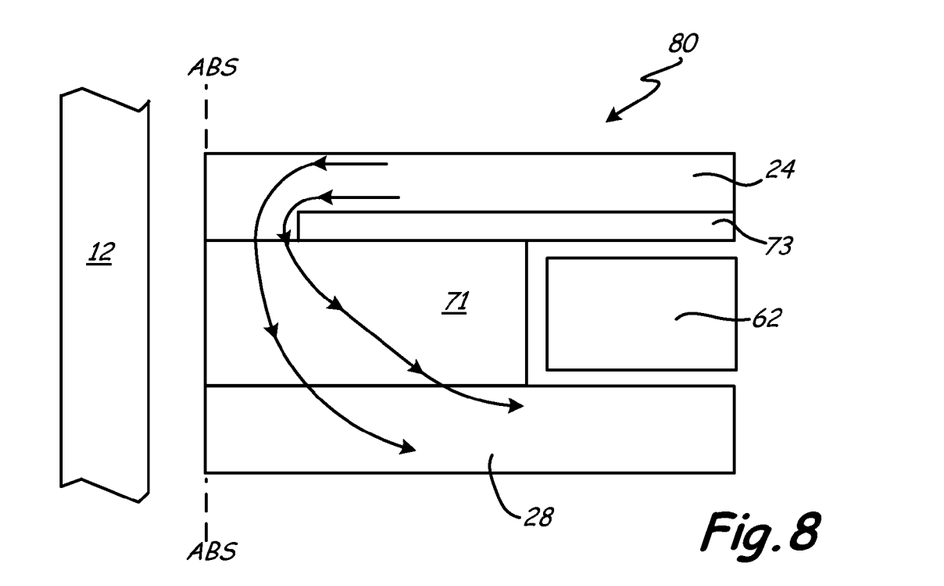

Another embodiment is shown in FIG. 8. CPP MR sensor 80 is comprised of trilayer MR stack 71 with a long stripe height positioned between bottom pole/top shield 24 and bottom shield 28 with back gap magnet 62 behind trilayer MR stack 71. In this case, insulator layer 73 is positioned between bottom pole/top shield 24 and trilayer MR stack 71. Insulator layer 73 extends from the back end of bottom shield 28 to a distance close to the ABS, thereby providing a constriction in the current flow from top shield 24 through trilayer MR stack 71 to bottom shield 28 as indicated by the arrows. By constricting the current flow to the vicinity of the ABS, electrical shunting at the back end of trilayer MR stack 71 is blocked resulting in increased sensor output.

Figure 9:
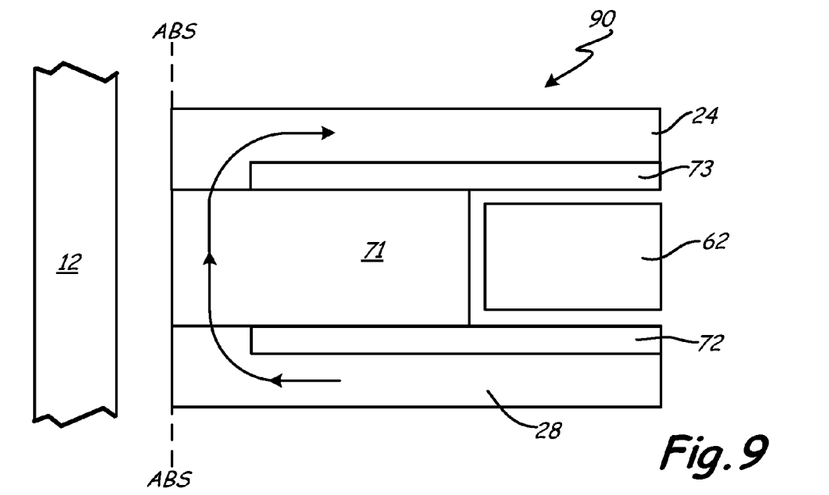

Another embodiment is shown in FIG. 9. CPP MR sensor 90 is comprised of trilayer MR stack 71 with a long stripe height positioned between bottom pole/top shield 24 and bottom shield 28 with back gap magnet 62 behind trilayer MR stack 71. In this case, insulator layer 73 is positioned between bottom pole/top shield 24 and trilayer MR stack 71 and insulator layer 72 is positioned between bottom shield 28 and trilayer MR stack 71. Insulator layers 72 and 73 extend from the back ends of top and bottom shields 24 and 28 to a distance close to the ABS thereby providing a constriction in the current flow between bottom pole/top shield 24 and bottom shield 28 or between bottom shield 28 and bottom pole/top shield 24 through trilayer MR stack 71. By constricting the current flow to the vicinity of the ABS, electrical shunting at the back end of trilayer MR stack 71 is blocked, resulting in increased sensor output.

Figure 10:
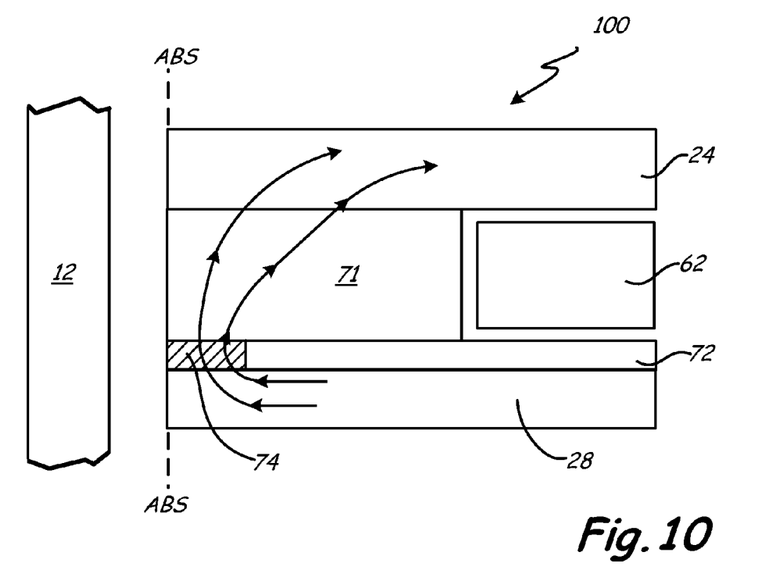

Another embodiment is shown in FIG. 10. CPP MR sensor 100 is comprised of trilayer MR stack 71 with a long stripe height positioned between bottom pole/top shield 24 and bottom shield 28 with back gap magnet 62 behind trilayer MR stack 71. Insulator layer 72 extends from the back end of bottom shield 28 to the ABS. In this case, a portion of insulator layer 72 proximate the ABS has been treated to transform insulator layer 72 into electrically conducting portion 74. Electrically conducting portion 74 provides a constriction in the current flow from bottom shield 28 to bottom pole/top shield 24 through trilayer MR stack 71 as indicated by the arrows. By constricting the current flow to the vicinity of the ABS as the current passes through trilayer MR stack 71, electrical shunting at the back end of trilayer MR stack 71 is blocked, resulting in increased sensor output.

Insulator layer 72 can be converted to electrically conducting region 74 after the ABS is lapped by a number of processes. Some of these are described here. One approach is to use co-sputtered Fe and $SiO_2$ as the insulating layer. The resulting $Fe/SiO_2$ layer is amorphous and electrically resistant. Preferential heat treatment of the ABS to moderate temperatures of about 350° C. to 400° C. by exposing the ABS to a laser beam will cause Fe segregation and the formation of electrically conductive channels close to the ABS. Another approach is to use a $TiO_x$ barrier layer as the insulating layer. Lapping the ABS containing $TiO_x$ insulating layers in an ordinary atmosphere or in hydrogen forms defects in the $TiO_x$ layers that form conductive channels, thereby allowing current flow at the ABS.

Insulator layers that have been transformed into conducting channels at the ABS to constrict current flow through sensor stack 71 at the ABS can also be positioned between bottom pole/top shield 24 and stack 71 and between bottom shield 28 and stack 71. It should be noted that the sensor stacks described above are merely illustrative and other configurations may be used in accordance with various embodiments of the present invention.

It has been found that introduction of insulator layer 72 in bottom shield electrical conductor 28 leads to manufacturing and device performance issues. A key step in the manufacture of CPP MR sensor 70 shown in FIG. 7 is the planarization of the tops of bottom shield electrical conductor 28 and insulator layer 72, i.e. surface S, before trilayer MR stack 71 is deposited. Planarization is accomplished by chemical mechanical polishing (CMP) whose techniques are well known to those versed in the art. Difficulties arise because the CMP polishing rates of dissimilar materials are different. This results in discontinuities in surface S. such as peaks and valleys in the surface in the vicinity of the intersection of shield 28 and insulator layer 72, in dishing in the insulator material, and other problems. The resulting unpredictable nature of surface S after planarization leads to device performance instability, lot to lot variation during processing, and increased manufacturing costs.

Figure 11:
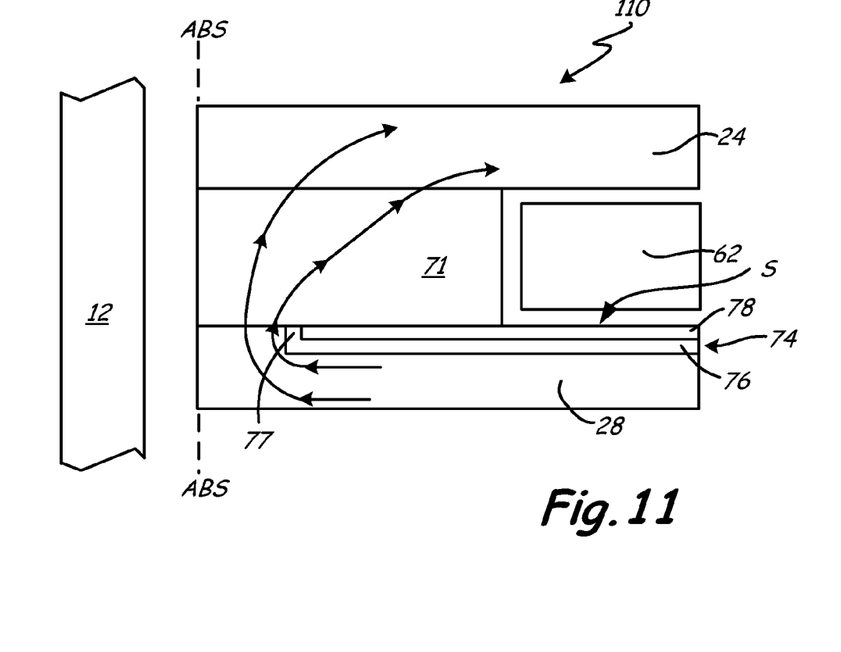
FIG. 11 is a schematic cross sectional view of an embodiment of the invention.
Figure 12:
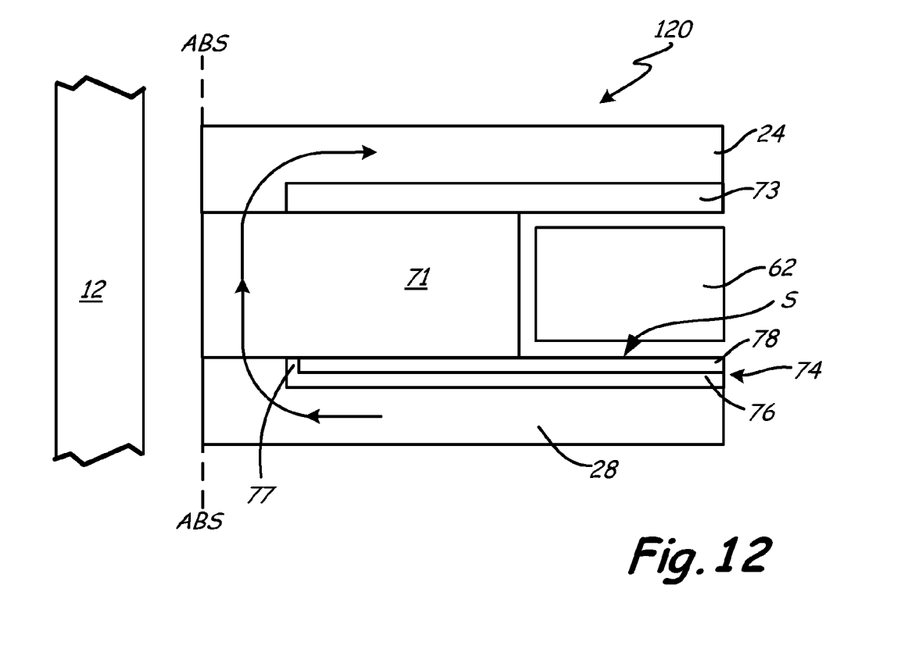
FIG. 12 is a schematic cross sectional view of another embodiment of the invention.
Figure 13:
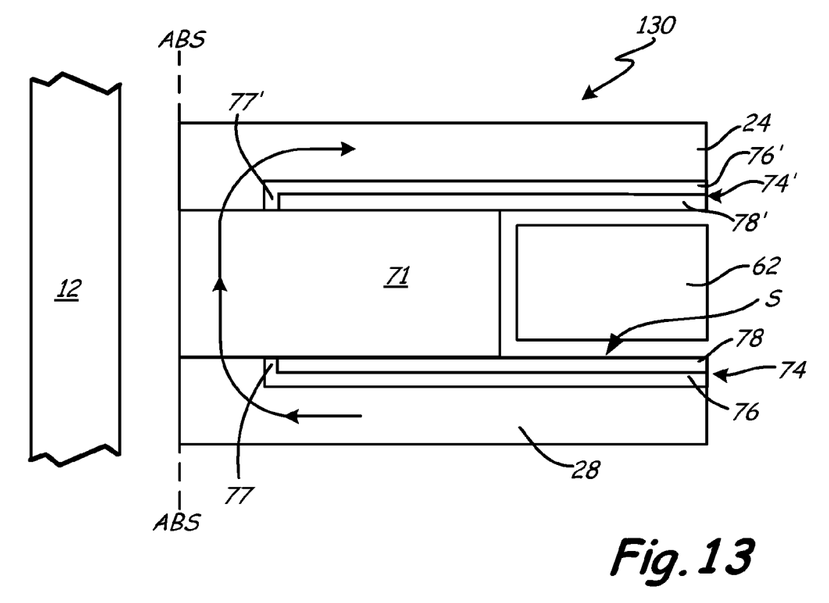
FIG. 13 is a schematic cross sectional view of another embodiment of the invention.

The problem has been circumvented by the inventive embodiment shown in FIGS. 11-13. FIG. 11 shows CPP MR sensor 110 comprising trilayer MR stack 71 with a long stripe height positioned between bottom pole/top shield 24 and bottom shield 28 with backgap magnet 62 behind trilayer MR stack 71. Insulator layer 72 has been replaced with multilayer insulator structure 74. Multilayer insulator structure 74 comprises insulator layer 76 and nonmagnetic metal conducting layer 78. Nonmagnetic metal conducting layer 78 has CMP polishing rates similar to bottom shield 76, thereby ensuring planarization of surface S during CMP. Insulating layer 76 contains insulating side wall 77 that ensures there is no conducting path between bottom shield 28 and nonmagnetic conducting layer 78. The thickness of sidewall 77 is between 3 nm to 5 nm.

Multilayer insulator structure 74 can also be employed in the embodiment shown in FIG. 9 as shown in FIG. 12. FIG. 12 shows CPP MR sensor 120 comprising trilayer MR stack 71 with a long stripe height positioned between bottom pole/top shield 24 and bottom shield 28 with back gap magnet 62 behind trilayer MR stack 71. Insulator layer 72 has been replaced with multilayer insulator structure 74. Multilayer insulator structure 74 comprises insulator layer 76 and nonmagnetic metal conducting layer 78. Nonmagnetic metal conducting layer 78 has CMP polishing rates similar to bottom shield 76, thereby ensuring planarization of surface S during CMP. Insulating layer 76 contains insulating side wall 77 that ensures there is no conducting path between bottom shield 28 and nonmagnetic conducting layer 78. The thickness of sidewall 77 is between 3 nm to 5 nm.

Another embodiment is shown in FIG. 13. FIG. 13 shows CPP MR sensor 130 comprising trilayer MR stack 71 with a long stripe height positioned between bottom pole/top shield 24 and bottom shield 28 with back gap magnet 62 behind trilayer MR stack 71. Insulator layer 73 has been replaced with multilayer insulator structure 74'. Multilayer insulator structure 74' comprises insulator layer 76' and nonmagnetic metal conducting layer 78'. Insulating layer 76' contains insulating sidewall 77' that ensures there is no conducting path between bottom pole/top shield 24 and nonmagnetic conducting layer 78'. The thickness of sidewall 77' is 3 nm to 5 nm.

Insulating layers 76 and 76' can be, among others, $Al_2O_3$, $SiO_2$, and SiON. Nonmagnetic metal conducting layers 78 and 78' can be, among others, Ru, Ta, Cr, and NiCr.

While the present disclosure has been described with reference to an exemplary embodiment(s), it will be understood by those skilled in the art that various changes may be made and equivalents may be substituted for elements thereof without departing from the scope of the claimed embodiments. In addition, many modifications may be made to adapt a particular situation or material to the teachings of the disclosure without departing from the essential scope thereof. Therefore, it is intended that the claimed technology not be limited to the particular embodiment(s) disclosed, but that the disclosure will include all embodiments falling within the scope of the appended claims.

The invention claimed is:

1. A magnetoresistive sensor comprising:
    a magnetically responsive stack positioned between top and bottom electrodes on an air bearing surface (ABS); and
    a first multilayer insulator structure between the magnetically responsive stack and at least one of the top and bottom electrodes, the first multilayer insulator layer structure comprises a first electrical insulator layer and a first nonmagnetic electrical conductor layer, the first electrical insulator layer and first nonmagnetic electrical conductor layer contact different portions of the magnetically responsive stack.

2. The sensor of claim 1, and further comprising a second electrical insulator layer between a portion of the electrode not occupied by the first multilayer insulator layer structure and a portion of the trilayer stack.

3. The sensor of claim 2 wherein the second electrical insulator layer is part of a second multilayer electrical insulator structure that includes the second electrical insulator layer and a second nonmagnetic electrical conductor layer, the second electrical insulator layer and second nonmagnetic electrical conductor layer contact different portions of the magnetically responsive stack.

4. The sensor of claim 2 wherein the bottom electrode and the first top nonmagnetic conductor layer have similar chemical mechanical polishing rates.

5. The sensor of claim 2, wherein the first nonmagnetic electrical conductor layer comprises one of Ru, Ta, Cr, and NiCr.

6. The sensor of claim 1, wherein the magnetically responsive stack comprises a plurality of ferromagnetic layers separated by a nonmagnetic layer as part of a trilayer stack, each ferromagnetic layer configured with magnetizations oriented about perpendicular to each other and about 45 degrees to an air bearing surface.

7. The sensor of claim 6, wherein the nonmagnetic layer of the trilayer stack is an electrical conductor.

8. The sensor of claim 7, wherein the nonmagnetic layer of the trilayer stack comprises one of Cu, Ag, Au, or an alloy thereof.

9. The sensor of claim 7, wherein the nonmagnetic layer of the trilayer stack is an electrical insulator.

10. The sensor of claim 9, wherein the nonmagnetic layer of the trilayer stack is selected from the group consisting of $Al_2O_x$, $TiO_x$, and MgO.

11. The sensor of claim 6, wherein the ferromagnetic layers of the trilayer stack are magnetically free layers.

12. The sensor of claim 11, wherein the free layers comprise one of FeCoB, NiFeCo, CoFeHf, NiFe, or an alloy thereof.

13. An apparatus comprising:
a trilayer stack positioned between top and bottom electrodes on an air bearing surface (ABS), the stack comprising a first ferromagnetic layer and a second ferromagnetic layer separated by a nonmagnetic layer;
a back biasing magnet adjacent a back end of the trilayer stack, distal the ABS; and
a first multilayer insulator lamination disposed between the trilayer stack and the bottom electrode, the first multilayer insulator lamination comprising:
a first electrical insulator layer and a first nonmagnetic electrical conductor layer the first electrical insulator layer and first nonmagnetic conductor layer contact different portions of trilayer stack.

14. The apparatus of claim 13, wherein the bottom electrode and the first nonmagnetic electrical conductor layer have similar chemical mechanical polishing rates.

15. The apparatus of claim 13 and further comprising a second electrical insulator layer contacting the top electrode and a portion of the trilayer stack.

16. The apparatus of claim 15 wherein the second electrical insulator layer is part of a second multi layer insulator lamination with a second nonmagnetic electrical conductor layer the second electrical insulator layer and second nonmagnetic electrical conductor layer contact different portions of the trilayer stack.

17. The apparatus of claim 13, wherein magnetization directions of the ferromagnetic layers of the trilayer stack are oriented about perpendicular to each other and about 45 degrees to an air bearing surface.

* * * * *